United States Patent [19]

Yang et al.

[11] Patent Number: 4,851,915
[45] Date of Patent: Jul. 25, 1989

[54] METHOD AND APPARATUS FOR OBTAINING CLEAR IMAGES OF HIGH SPEED MOVING OBJECTS

[75] Inventors: Jinyu Yang; Renxia Lu, both of Xian, China

[73] Assignees: Xian Northwest Telecommunication Engineering Inst.; Xian Intnl. Economic Tech. Trade Corp., both of Xian, China

[21] Appl. No.: 82,628

[22] Filed: Aug. 7, 1987

[30] Foreign Application Priority Data

Aug. 11, 1986 [CN] China ................................ 86205900
Oct. 18, 1986 [CN] China ................................ 86107106

[51] Int. Cl.⁴ ......................... H04N 3/14; H04N 5/235
[52] U.S. Cl. ............................ 358/213.19; 358/213.31; 357/24
[58] Field of Search ............... 358/213.19, 213.13, 358/213.29, 213.31; 357/24 LR, 30 H

[56] References Cited

U.S. PATENT DOCUMENTS

| | | | |
|---|---|---|---|
| 3,931,463 | 1/1976 | Levine | 358/213.26 |
| 4,564,666 | 1/1986 | Kuroda et al. | 250/578 |
| 4,564,766 | 1/1986 | Kuroda et al. | 358/213.22 |
| 4,573,078 | 2/1986 | Rentsch et al. | 358/213.13 |
| 4,577,115 | 3/1986 | Rentsch et al. | 358/213.13 |
| 4,686,572 | 8/1987 | Takatsu | 358/213.13 |

OTHER PUBLICATIONS

"Electronic Shutter CCD Pick-Up Camera", article appearing in Mapping Information, Japan vol. 16, No. 6, p. 87, Mar. 1984.

*Primary Examiner*—Jin F. Ng
*Assistant Examiner*—Stephen Brinich
*Attorney, Agent, or Firm*—David H. Semmes

[57] ABSTRACT

This method is a direct development method for achieving a solid state image pickup device with a high speed electronic shutter on itself. A field integrating time is divided into a useless integrating time and a useful integrating time. The shorter one is the useful integrating time, the faster one is the electronic shutter speed. The useless integrated charges are cleared by the "photographic plate" clearing method. This image pickup camera apparatus is a high speed image pickup camera apparatus having low or slight high frame frequency, short explosure. A clear, relatively still or very slowly spinning images can be obtained by adjusting the field frequency of the high speed pickup camera apparatus.

5 Claims, 5 Drawing Sheets

METHOD AND APPARATUS FOR OBTAINING CLEAR IMAGES OF HIGH SPEED MOVING OBJECTS

The present invention generally relates to a method and apparatus for obtaining clear images of high speed moving objects, in particular, relates to such a method and apparatus whereby an electronic shutter function of a solid state image pickup device on itself is developed.

As far as an ordinary pickup camera goes, because it's image pickup device has inertia and low speed shutter, it is obsolutely impossible to obtain clear images of high speed moving objects such as a quickly running car or a motorcar, a rotating rotor of a generator or of a motor and a spinning spindle of a spinning machine. A solid state image pickup device of an ordinary solid state pickup camera is one of the devices having the least inertia so far. When it operates at PAL television system, the charge integrating time is 20 ms per field corresponding to a shutter having an exposure time of 1/50 second. Thus, an image of a high speed moving object on the image pickup device has brought forth obvious movements i.e. repeated exposures within 20 ms, therefore the ordinary solid state pickup camera is still impossible to obtain clear images of high speed moving objects. An ordinary high speed solid state pickup camera comprises an ordinary solid state pickup camera and an additional mechanical shutter or electronic shutter. Disadvantages of mechanical shutters are its poor opening property, poor stability, poor reliablity and limitary life time. Disadvantages of electronic shutters made of PLZT (Pb-Based LanthanumDoped Zirconate Titanates) used in the apparatus discribed in the article entitled "Electronic shutter CCD Pickup Camera" in "Mapping Information" ("测绘 中报") Japan Vol. 16, No. 6, P87 are that its control circuit is huge and complicated, because its dielectric constant is up to 4000 at room temperature, it results in a quite high electric field required for controlling the electronic shutter, for example, a PLZT piece with 1 mm in thickness requires an electric field of 450 v/mm, so it is expensive, and that the PLZT light-sensitive devices have poor transmissivity, loss of more light and limitary life time. Particularly it is costly to shorten its opening time. This is the fatal weakness of the PLZT electronic shutter device.

The method for reading out image charges from field to field described in U.S. Pat. No. 4,564,766 entitled Uninterruptible Switching Power Supply System is that charges in a group of photoelectric conversion elements of odd rows are to be read out in the first field of a frame and to be cleared out in the second field of the frame and charges in the group of photoelectric conversion elements of even rows are to be read out in the second field of the frame and to be cleared out in the first field of another frame. Although the said method keeps the advantgag of the interlaced scanning and develops an electronic shutter of the image pickup device on itself, it only raises the corresponding shutter speed from 1/30 second to 1/60 second. It is evident that the shutter speed is not enough to eliminate the image blur caused by repeated exposures of a high speed moving object.

The main object of the present invention is to overcome the disadvantages of solid state image pickup cameras of the prior art and to provide a method for developing an electronic shutter function of a solid state image pickup device on itself and for making its "shutter" speed up to 1/1000, 1/2000 second or more higher, and an apparatus for obtaining clear images of high speed moving objects without an additional shutter, so that the disadvantages of adding an additional shutter vanish from themselves and the cost is reduced greatly.

Another object of the present invention is to provide a new type of high speed solid state pickup camera apparatus having its "shutter" speed easy to adjust, which can be adjusted not only continuously, but also by the conventional grades such as 1/50, ..., 1/1000, 1/2000 second or more, which is both used as an ordinary pickup camera and as a high speed pickup camera.

Still another object of the present invention is to cause the "electronic shutters" of the several pickup cameras apparatus of the present invention to be controlled respectively to take the same object, so as to increase the image numbers per second on a screen of a videorecorder.

Still another object of the present invention is to provide a method for obtaining clear, relatively still or slowrotating images of high speed spinning bodies such as machine tools, spinning machines, generators, motors and so on.

The above objects and other objects, features and advantages of the present invention will be further evident from the detailed description referring to the drawings as below:

Figure 1:
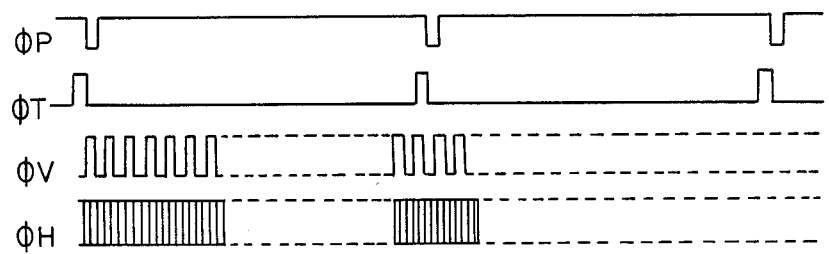
FIG. 1 shows the waves forms of the main driving pulses of a solid state image pickup device in the prior art.

Now referring to FIG. 1. FIG. 1 shows the wave forms of the main driving pulses of the prior art solid state image pickup device (for example a interline transferring CCD (charge coupled device)), wherein $\phi_p$ is the string of the field charge integrating pulses, $\phi_t$ is the string of the charge transfer controlling pulses, $\phi_v$ is the string of the vertical shift clock pulses (only one phase shown here), and $\phi_m$ is the string of the horizontal shift clock pulses (only one phase shown here). When $\phi_p$ is at high level and $\phi_t$ is at low level, the photoelectrical converting units integrate light-produced charges. When $\phi_p$ is at low level and $\phi_t$ is at high level, the light-produced charges are to be transferred from the photoelectrical converting units to the vertical shift registers, then the light-produced charges are shifted to the horizontal shift registers from line to line under $\phi_v$ driving, in turn the light-produced charges are read out to from the horizontal shift registers to an image signal processing means under $\phi_h$ driving, at last the light-produced charges as video image signals are displayed on the screen of the videorecorder.

The present invention intends to change the driving pulse string $\phi_p$ of the solid state image pickup device of prior art which has a charge integrating time of 20 ms per field into $\phi'_p$ which has twin pulses for integrating charges per field, the first pulse is called the useless charge integrating pulse and the last pulse is called the useful charge integrating pulse. The present invention also intends to shorten the width of the useful charge integrating pulse in order to play a role of an electronic shutter. The speed of the "shutter" is raised, as the width of the useful charge integrating pulse is shortened. When the width is shortened to 1 ms, the speed of the "shutter" is raised to 1/1000 second. The "shutter" differs from an additional shutter means. Because the "shutter" does not have a substantial additional shutter means, so its image pickup apparatus is at the exposure state from beginning to the end, while an additional shutter means is shut in normal times, and only at the moment when it is opened it is in the exposure state. When the useful charge integrating time is 1 ms, the useless charge integrating time is 19 ms. If the light-produced charges during the useless charge integrating time are cleared before the useful charges are integrated, the useful charges will be integrated on the clean "photographic plate" which is without the disturbance of the useless charges, thus clear images which are equivalent to that of short exposure are obtained from the above. The present invention provides two methods for clearing useless charges (i.e. the "photographic plate" clearing methods), the quickly pushing out method and the quickly discharging method. The difference between the two methods lies in the different ways of clearing the useless charges. In order to understand it easily, an interline transfer CCD will be described by way of an example.

Figure 2:
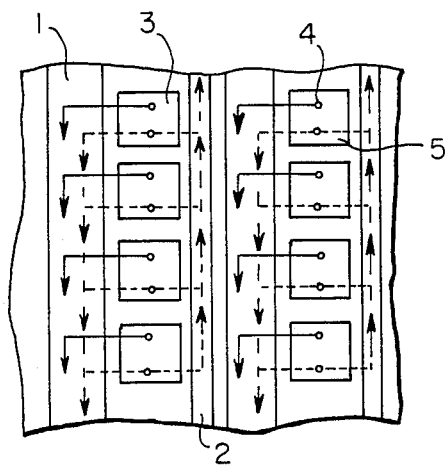
FIG. 2 shows schematically the useful charges and useless charges in the solid state image pickup device reading out through the first channel and the second channel respectively.

As FIG. 2 shows, there are two channels for reading out the charges in the solid state image pickup device according to the present invention. From the first reading out channel 1, both the useful integrating charges 4 (the image signal charges) in the photoelectrical converting units 3 and the useless integrating charge 5 in the photoelectrical converting units 3 are read out, while from the second reading out channel 2 only the useless integrating charges 5 are read out. The first reading out channel 1, i.e. the conventional reading out channel of image charges for example an interline transfer CCD, comprises the vertical shift registers and the horizontal shift registers or an additional channel. The second reading out channel 2 is the channel for the useless charges 5 which are quickly discharged, for example, with using OFCG configuration and applying a string of clearing pulses, it can make the useless charges quickly discharge from the discharging channel 2 to the semiconductor substrate.

Figure 3:
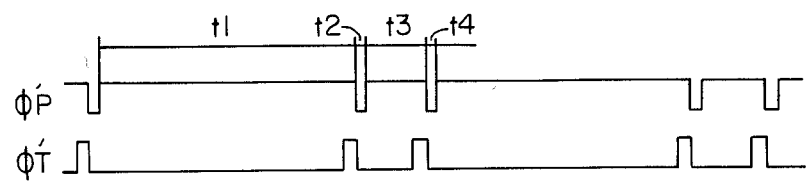
FIG. 3 shows the time relationship between the twice integrations and the twice readouts per field according to the present invention.

The method for obtaining clear images of high speed moving objects, which makes use of a solid state image pickup divice having a high speed electronic shutter to obtain clear images of high speed moving objects, comprises the steps of:

The first step, generating a field charge integrating pulse string $\phi'_p$ and a charge transfer controlling pulse string $\phi'_t$. As shown in FIG. 3, $\phi'_p$ and $\phi'_t$ have twin pulses per field. The first pulse is the useless charge integrating pulse having the duration $t_1$. The second pulse is the useful charge integrating pulse having the duration $t_3$. Because $\phi'_p$ and $\phi'_t$ add one more pulse per field, than $\phi_p$ and $\phi_t$, the reading out manner of the integrating charges changes from once per field of the prior art into twice per field, particularly since during $t_1$ useless charges are integrated in photoelectrical units; while during $t_2$ the useless charges are read out (or cleared out), which is to clean the "photographic plate" and to empty it and to prepare the useful charges for being integrated on it. As a result no useless charges disturb within the period of useful charges being integrated; during $t_3$ useful charges are integrated; during $t_4$ the useful integrated charges representing the image signals of the taken object are read out to the vertical shift registers of the first reading out channel. The shorter is the time of the said useful charge integration, the faster is the said "shutter" speed.

The second step, reading the useless integrated charges and clearing out them very soon so as to clear the charge integrating regions and charge registering regions (which is called the "photographic plate"), so as to prepare the useful charges for being integrated on the charge registering regions where there are no useless integrated charges to disturb. Useless integrated charges can be cleared out through two channels which are designated as the first reading out channel and the second reading out channel. The first reading out channel comprises vertical shift registers and horizontal shift registers or an additional channel from the vertical shift registers to a substrate of the device. The method for clearing the useless integrated charges through the first channel uses two kinds of methods which are called the quickly pushing out method or the quickly discharging method. The method for clearing the useless integrated charges through the second channel uses another discharging method.

Figure 4:
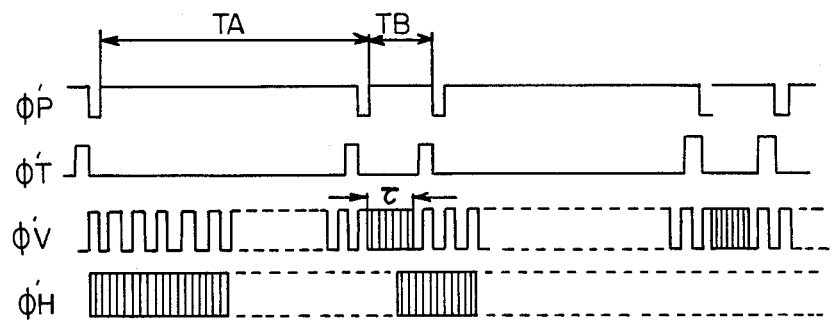
FIG. 4 shows the waves forms of the pulses of the clearing method for quickly pushing out the useless integrating charges.

The quickly pushing out method is suitable for the currently merchandised image pickup devices. It comprises the steps of:

generating the vertical shift clock pulse string $\phi'_v$, as shown in FIG. 4 which comprises two sets of clock pulses, with each set of clock pulses having a clock frequency. The first clock frequency is equal to the clock frequency of $\phi_v$ (FIG. 1) and the second clock frequency is a high frequency having the duration $\tau$ ($\tau < t_3$), the beginning of which appears at the particular time when the integration of the useless integrated charges just ends.

Pushing out the useless integrated charges in the vertical shift registers to the horizontal shift registers under the control of the second clock frequency of $\phi'_v$ during enables the vertical shift registers to be cleared. Then reading out the useless integrated charges in the horizontal shift registers to a signal processing means may be accomplished under $\phi H$ driving. It is understandable that during the time when quickly pushing out the useless integrated charges, the horizontal shift registers are faced with the stroke of the impact wavegushing-like of the useless integrated charges. Because the second clock frequency duration $\tau$ corresponds to the time of several lines, the useless integrated charges will appear on a screen as several bright lines.

If the time of the useful charge integration (i.e. the time of the "shutter" openning) is shorter than the time of the field blanking, the several bright lines will be blanked. If the time of the useful charge integration is longer than the time of the field blanking, the several bright lines will appear on the image. Thus it can be seen that although the quickly pushing out method has the features of being easily put into practice at a slight increase of cost, it still has the disadvantage of having a small range of adjustment of the "shutter speed", this is because the lowest "shutter speed" is limited by the blanking time, and the fastest "shutter speed" is limited by the highest operating frequency of the vertical shift registers of the currently merchandised image pickup devices. The currently merchandised image pickup devices useally obtain such "shutter" speeds, about 1/1000, 1/2000 second. The improved configuration can obtain "shutter" speed higher than that of the above.

The quickly discharging method can only be used on the basis of changing the inner configuration of the image pickup devices, for example, an additional channel onto the substrate of the semiconductor can be added and arranged near the side of the vertical shift registers, so as to quickly discharge the useless integrated charges in the vertical shift registers of the first reading out channel to the substrate of the semiconductor under a clearing pulse string $\phi_l$ (FIG. 5) driving.

Figure 5:
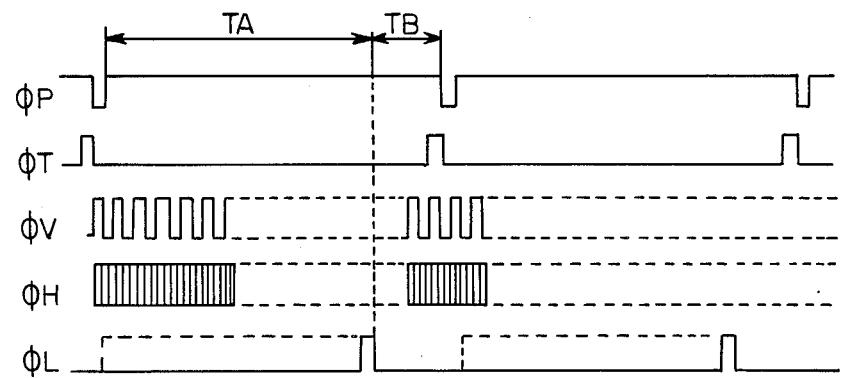
FIG. 5 shows the waves forms of the pulses of the clearing method for discharging the useless integrating charges through the second channel.

Another discharging method is used to clear the useless integrated charges which are transfered to the second channel. This method is suitable to such image pickup devices which have a second reading out channel for discharging the charges to the substrate of the semiconductor, and the second reading out channel is arranged on the other side of the light-sensitive units, which side is not adjacent to the vertical shift registers, for instance, the overflow drain configuration havng OFCG (overflow control gate). As shown in FIG. 5, clearing pulse string $\phi_l$ is applied onto the corresponding configuration. When $\phi_l$ is at high level, the useless integrated charges drain to the potential well and then to the substrate of the semiconductor of the device.

Figure 6A:
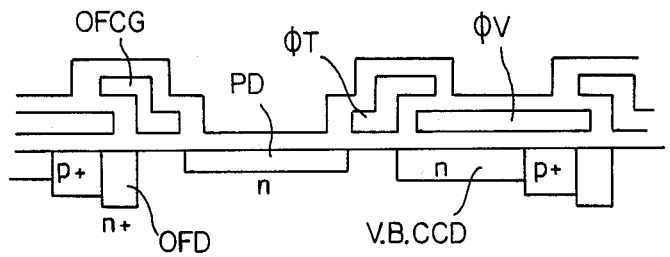
FIG. 6a shows a cross section of photoelectrical converting units of a interline transferring pickup camera.
Figure 6B:
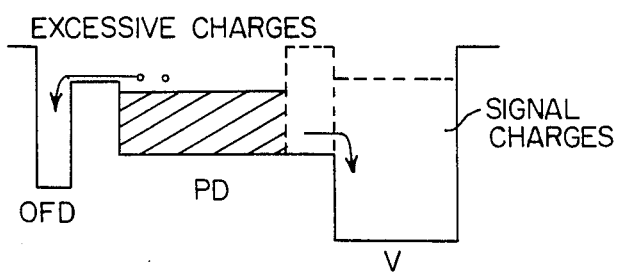
FIG. 6b shows a surface potential distribution while the image pickup device uses the overflow drain.
Figure 6C:
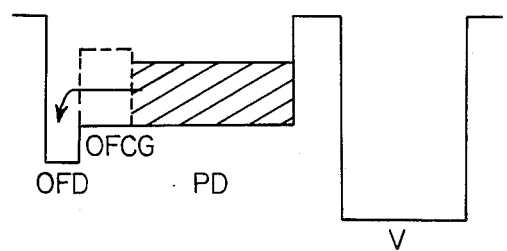
FIG. 6c shows a surface potential distribution while the image pickup device clears the "photographic plate"

Now the process for clearing the useless integrated charges will be described by way of example of an interline transfer CCD with OFCG as shown in FIG. 6a. In FIG. 6a OFD is an overflow drain, OFCG is an overflow control gate, PD is a photoelectrical converting unit. When the device is used as the overflow drain, a D.C. positive voltage $V_{co}$ is applied to the OFCG so that the height of the potential barrier between the controlled OFD and PD is slightly lower than that of the other three sides of the PD potential well as shown in FIG. 6b, the dotted lines representing the potential barrier between the photoelectrical converting unit PD and the vertical shift register V is one side of the three sides. When strong light shines on it, excessive charges will be drained to the OFD through the slight lower potential barrier, so as to restrain the diffusion phenomenon. The height of the potential barrier between OFD and PD can be controlled by adjusting the voltage $V_{co}$ of the OFCG. The higher is the $V_{co}$, the lower is the height of the potential barrier, more charges will be drained. The "photographic plate" cleaning technology of the present invention is just developed on this basis.

The key point of the present invention is that the cleaning pulse string $\phi_l$ shown in FIG. 5 is applied onto the OFCG. The low level of $\phi_l$ is the D.C. voltage $V_{co}$, the high level of $\phi_l$ is determined by the different configurations of the devices, but it should make the potential barrier between the OFD and the PD vanish, for draining all the useless integrated charges all, so as to achieve the object of cleaning the "photographic plate". The width of the clearing pulse shown in FIG. 5 can be used as both the dotted line and the real line. The principle of the clearing method of the present invention is that during the time of the useless charges being integrated, because the high level of $\phi_l$ is applied on the OFCG, the potential barrier between the OFD and the PD may vanish throughout, so that all the useless integrated charges are drained away, thus the object of cleaning the "photographic plate is achieved. At the moment when the useless charge integration ends, the level of $\phi_l$ is changed from high to low OFCD is to restore to $V_{co}$ the useful charge integration begins. At this moment the surface potential distribution of the device is as that shown in FIG. 6b, the potential barrier of a certain height are formed again between the OFD and the PD, from which the normal integration and the transfer of the useful integrated charges on the clean "photographic plate" are guaranteed, therefore, clear images will be obtained.

It should be noted that $\phi_p$ and $\phi_t$ in FIG. 5 still are one pulse per field, but $T_A$ and $T_b$ are the time of the useless charge integration and the time of the useful charge integration respectively, and the operating manner is still integration twice and reading out twice per field.

Of course, other configurations can also be used for clearing the useless integrated charges. This method for clearing the useless integrated charges through the second reading out channel compared with the above method which is through of the first reading out channel has an advantage that the slowest speed of its "shutter" is not limited by the time of the field blanking. This occurs because the adjustment of the interval $(T_B)$ between $\phi_l$ and $\phi_t$ shown in FIG. 5 is only related with the time of the useful integration and does not influence the reading out of the useful integrated charges through the first reading out channel at all. If the device can be drived at a clock with a frequency of kilomegahertz level, the interval $T_B$ can be wantonly adjusted within the range of 20 ms to ns. If a timing means is added, the "shutter" speed can also have the range of that of the conventional shutter speed level such as 1/50, 1/125, 1/250 second and so on.

The third step, comprises reading out the useful integrated charges which will be the image signal of the taken object through the first reading out channel. When using the quickly pushing out method, the useful integrated charges are read out from the vertical shift registers to the horizontal shift registers during the duration of the first clock frequency of $\phi'_v$ which has the same frequency as $\phi_v$. Then the useful integrated charges are read out from the horizontal shift registers to a signal processing means under $\phi H$ driving, at last being the image signals that will be displayed on the screen of the videorecorder.

Because the image pickup apparatus developed by the method of the present invention is a kind of high speed image pickup camera with low frame frequency, and low cost, including an electronic shutter, it can be connected with an ordinary videorecorder. Therefore the cost necessary to form a complete set is low and the image signals of high speed moving objects can easily be processed by means of an ordinary microprocessor. The apparatus of the present invention comprises a CCD image pickup device, a CCD driving pulse generator, a CCD driver and a signal processor. When several of the above image pickup apparatus are connected with a videorecorder and take the same object, their electronic shutters are respectively controlled in their given order by a pulse distributor so that the effect of increasing image numbers per second can be obtained.

Because the image pickup apparatus of the present invention belongs to the class of image pickup apparatus with low frame-frequency and short exposure, so when it is used for taking a high speed spinning body, the high speed spinning body can be sampled based on the field frequency. When the frequency of the spinning body is equal to the integral times of the field frequency, because the sample point of the image pickup apparatus each time is the same point of the same spinning body, a clear, relatively still image of he spinning body reappears on the videorecorder. When the frequency of the spinning body is higher than the integral times of the field frequency, a clear, slow, positively rotating image of the spinning body reappears on the videocorder, it's rotating frequency being the least difference of the above two frequencies. Otherwise, a clear, slow, negatively rotating image of the spinning body reappears on the videocorder. Further, a clear relatively still, image of the high speed spinning body can be obtained by adjusting the clock frequencies of the image pickup camera apparatus of the present invention. Therefore, it is very convenient to do the monitoring, repairing, and turning of a high speed spinning body by using the image pickup camera apparatus of the present invention, particularly, it is suitable to monitor a quickly running car along the high speed road, because this situation does not require hundreds of even thousands of images per second.

An embodiment using the quickly pushing out method with the XC 37/38 black and white CCD image pickup camera produced by the Sony corporation in Japan will now be described below.

Figure 7A:
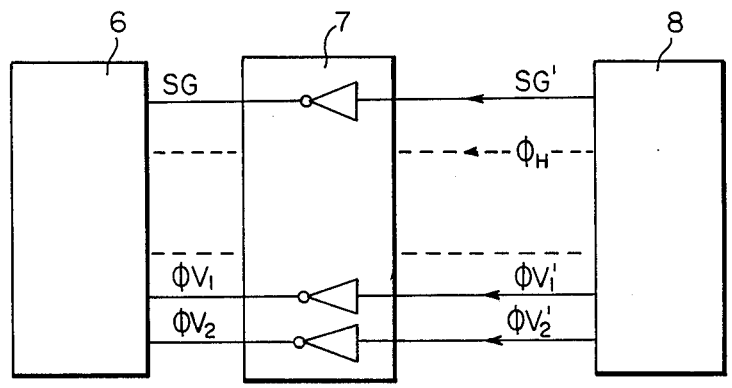
FIG. 7a and 7b are schematics of the waves forms of the driving pulses of XC 37/38 pickup camera produced by the Sony corporation in Japan respectively.
Figure 7B:
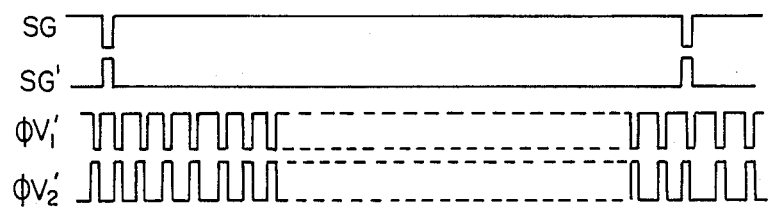

FIGS. 7a and 7b are the schematics of the driving portion of the image pickup device of XC 37/38 and the wave forms of its driving pulses respectively.

Since XC-37/38 pickup camera has an improvement in its configuration, so the pulses $\phi_p$ and $\phi_t$ are combined to form a new pulse string SG. When SG is at a high level, charges are integrated. When SG is lowered from a high level, the integrated charges are transferred to the vertical shift registers. The vertical shift pulse has two phases $\phi_{v1}$ and $\phi_{v2}$. The horizontal shift pulse is $\phi_H$ (it is not shown in FIG. 7b). A CCD image pickup device is indicated in FIG. 7a with the reference number 6. Reference number 7 is referred to A CCD driver (inverted amplifier). A CCD driving pulse generator 8 comprises a twin pulses generator for generating $\phi'_p$ which has twin pulses per field and a twin clock frequencies generator for generating $\phi'_v$ which has two sets of clock pulses, within each set of clock pulses having a frequency, the first clock frequency being equal to the frequency of $\phi_v$, the second clock frequency being a high frequency having the duration $\tau$ ($\tau < t_3$), the beginning of the second set of clock pulses appears at the particular time when the integration of the useless integrated charges just ends.

Figure 8A:
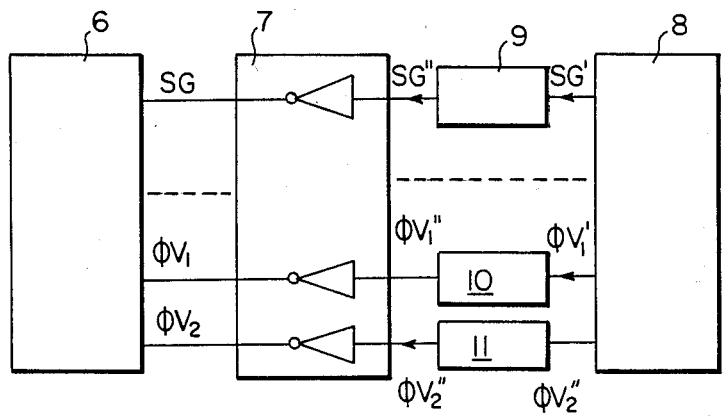
FIG. 8a and 8b are schematics of the waves forms of the driving pulses of the high speed image pickup apparatus of the embodiment of the present invention respectively.
Figure 8B:
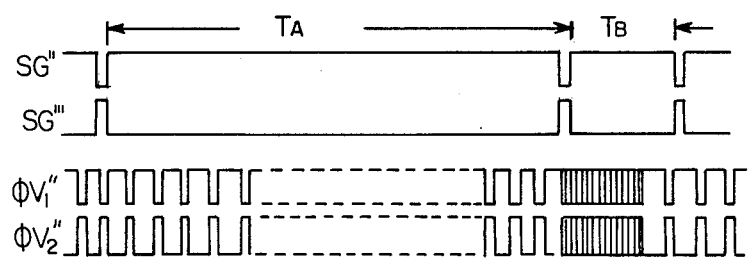

FIGS. 8a and 8b are the schematics of the embodiment of the high speed image pickup apparatus of the present invention and the wave forms of its driving pulses respectively. In FIG. 8a, the twin pulses generator is indicated by the reference number 9. Reference number 10 and 11 are the twin clock generators. The quickly pushing out method is employed in the said embodiment, through which all useless integrated charges are cleared through the first reading out channel. The charge integrating pulse string SG'' having two pulses per field and the clock pulse strings $\phi''_{v1}$ and $\phi''_{v2}$ having two pulses per field are all shown in FIG. 8b.

FIGS. 9a, 9b and FIGS. 10a, 10b are the specific circuits and the wave forms for generating the above twin pulses and twin clocks, respectively.

The twin pulses generator 9 also comprises a timing means for adjusting the electronic shutter speed of the device on itself, and the twin clock frequencies generator comprises a high frequency generator for generating said high frequency pulses of the vertical shift clock pulse string $\phi'_v$ for cleaning the "photographic plate".

Figure 9B:
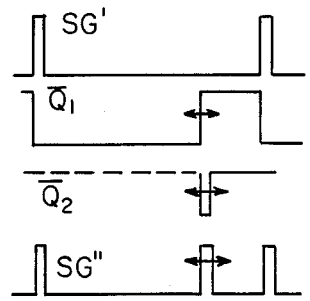
FIG. 9a and 9b are circuit diagrams of the twin pulses generator and the wave forms of the pulses respectively.
Figure 9A:
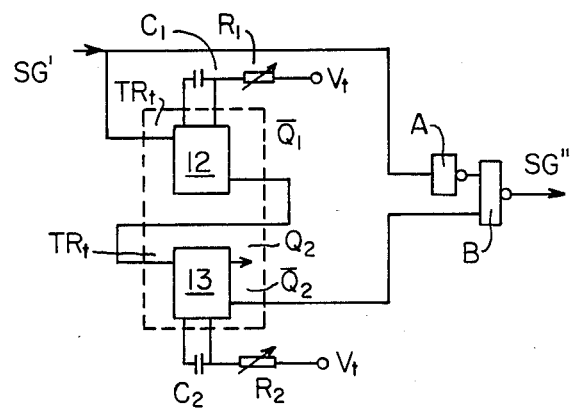

As FIGS. 9a and 9b show, when the field integrating pulse SG' is raised from a low level to a high level (indicated by TR$_+$), the monostable flip-flop 12 is triggered and a negative pulse with a width of $\tau_1$ can be obtained at the output terminal $\overline{Q}_1$. $\tau_1$ is determined by the multiplication of $R_1$ and $C_1$. The width $\tau_1$ of the negative pulse can be changed, as $R_1$ is adjusted, that is, the time of the useless charge integration is changed. When the time of the field scanning is given, the wider is the $\tau_1$, the shorter is the opening time of the "shutter". The negative pulse from the output terminal $\overline{Q}_1$ then triggers the monostable flip-flop 13 and the negative pulse with the width of $\tau_2$ which is determined by the multiplication of $R_2$ and $C_2$ is obtained at the output terminal $\overline{Q}HD$ 2. Let $\tau_2$ be equal to the width of SG' by adjusting $R_2$. After the pulse with the width of $\tau_2$ and SG' which is inverted by the AND NOT gate A are added at the AND NOT gate B, the SG'' is obtained which has twin pulses per field.

Figure 10B:
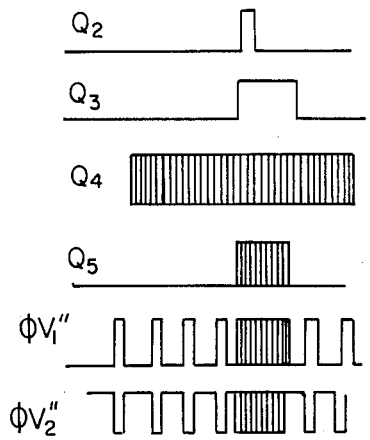
FIG. 10a and 10b are circuit diagrams of the twin clock pulses generator and the wave forms of the pulses respectively.
Figure 10A:
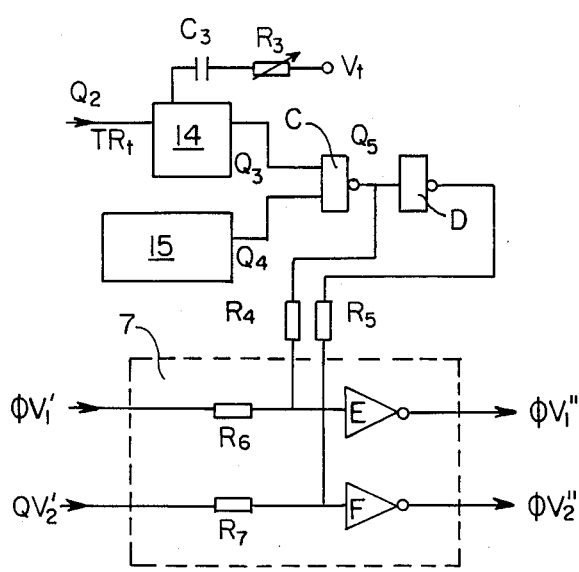

Referring to FIGS. 10a and 10b, when the monstable flip-flop 14 is triggered by the positive pulse from the output terminal $Q_2$ of the monostable flip-flop 13, the positive pulse with the width of $\tau_3$ is obtained at the output terminal $Q_3$. This positive pulse with its width $\tau_3$ is applied to one of the input terminal of the AND NOT gate C. And the output terminal of the high frequency pulse generator 15 having continuous, oscillation is connected to the other input terminal of the AND NOT gate C. Only when $Q_3$ is at a high level, the AND NOT gate C provides high frequency pulse output, the high frequency pulse outputs with the duration time $\tau_3$ provided by the AND NOT gates C and D through the resistances $R_4$ and $R_5$ respectively and the twophase vertical shift pulses $\phi'_{v1}$ and $\phi'_{v2}$ through resistance $R_6$ and $R_7$ are added at the input terminal the amplifier E and F. Therefore $\phi''_{v1}$ and $\phi''_{v2}$ are obtained at the output terminals of E and F respectively. The beginning position of the high frequency clock of the clock pulses $\phi''_{v1}$ and $\phi''_{v2}$ follow the back edge of the useless integrating pulse. The duration time of the high frequency clock can not exceed the time of the useful integration (that is the opening time of the electronic shutter).

A image pickup camera produced by Sony Corporation has been modified as a high speed image pickup apparatus. Now the process of its operation is described below. Referring to FIG. 8b, the interval $T_A$ between the first pulse of SG'' relative to the pulse of SG (FIG.

7b) and the second pulse of SG" is the useless integrating time. Upon ending the useless integration (that is, upon ending $T_A$), the useless integrated charges are to be transferred to the vertical shift registers of the first reading out channel. Then upon arising the edge of the second pulse of SG", the useful integrated charges being to integrate on the cleaned "photographic plate" which was just cleaned. At the same time, the high frequency clock pulses of $\phi''_{v1}$ and $\phi''_{v2}$ are applied to the vertical shift registers. These useless integrated charges are quickly pushed out to the horizontal shift registers within the time of the duration of several lines. From this the object of clearing the integrating region and the vertical shift region is achieved. Upon ending the useful charge integration (that is, upon ending $T_B$), the useful integrated charges are to be transferred to the vertical shift registers. Then the useful integrated charges are transferred to the horizontal shift registers under the driving of the low frequency clock of $\phi''_{v1}$ and $\phi''_{v2}$. In turn, the useful integrated charges are read out from the horizontal shift registers under the driving of $\phi_H$. At last they are displayed on the screen of the videorecorder as the image of the taken object.

Although the present invention has been described herein, with regard to an examplary embodiment, it is understood that other configurations or arrangements may be developed which nevertheless do not depart from the spirit and scope of the present invention.

What is claimed is:

1. A method for obtaining clear images of high speed moving objects, which utilizes a solid state image pickup device having a high speed electronic shutter on itself to clear images of high speed moving objects, comprising the steps of:
   (a) a first step of generating a twin pulse field charge integrating pulse string ($\phi'_p$) and a twin pulse charge transfer controlling pulse string ($\phi''_t$) to integrate charges in photoelectrical units twice per field as a result of the said field integrating pulse string ($\phi'_p$) driving, and to read out integrated charges twice each field as a result of the said charge transfer controlling pulse string ($\phi'_t$) driving, said integrated charges comprising useful integrated charges and useless integrated charges, so that the shorter the time of said useful charge integration, the faster a shutter speed;
   (b) a second step of reading out the said useless integrated charges and clearing out them very soon so as to clear charge integrating regions and charge registering regions identified as a photographic plate, preparing said useful charges for being integrated onto said photographic plate where there are no said useless integrated charges to disturb;
   (b1) clearing said useless integrated charges through two reading out channels, said useless integrated charges being cleared through a first reading out channel using a quickly pushing out/discharging method and said useless integrated charges being cleared through a second reading out channel using another quickly pushing out/discharging method derived from photoelectric converting units to a substrate of the device; and
   (c) a third step of reading out the said useful integrated charges which will be image signals through the said first reading out channel.

2. The method according to claim 1, wherein the said quickly pushing out/discharging method (b1) comprises the steps of:
   (a) generating a vertical shift clock pulse string ($\phi'_v$) which comprises two sets of clock pulses within each set of clock pulses having a separate frequency, a first clock frequency being equal to the clock frequency of the conventional vertical shift clock pulse string ($\phi_v$), a second clock frequency being a high frequency having the duration time ($\tau$), ($\tau$) being less than the duration time ($\tau_3$) of the second pulse of said field charge integrating pulse string ($\phi'_p$), the beginning of the second set of clock pulses appearing at the particular time when the said integration of the useless integrated charges has just ended;
   (b) pushing out said useless integrated charges in the said vertical shift registers to the said horizontal shift registers as a result of the second clock of said vertical shift clock pulse string ($\phi'_v$) during the said duration time ($\tau$); and
   (c) reading out the said useless integrated charges in the said horizontal shift registers to a signal processing means as a result of a conventional horizontal shift clock pulse string ($\phi_H$) driving.

3. The method according to claim 1, wherein said quickly discharging method comprises the step of:
   (a) discharging the said useless integrated charges in said vertical shift registers through said additional channel to the substrate of said device as a result of a clearing pulse string ($\phi_L$) driving.

4. The method according to claim 1, wherein the other said discharging method comprises the steps of:
   (a) draining the said useless integrated charges in said photoelectric converting units to said second reading out channel as a result of the said clearing pulse string ($\phi_L$) driving; and
   (b) discharging the said useless integrated charges through the said second reading out channel to the substrate of said device.

5. The method according to claim 1, wherein the step of reading out the said useful integrated charges reading out channel to said horizontal shift registers of said first reading out channel is as a result of the said first clock of said vertical shift clock pulse string ($\phi'_v$) driving during the duration time of said first clock of said vertical shift clock pulse string ($\phi'_v$); and the step of reading out the said useful integrated charges which will be image signals in said horizontal shift registers to said signal processing means is as a result of the said conventional horizontal shift clock pulse string ($\phi_H$) driving.

* * * * *